(12) United States Patent
Dao

(10) Patent No.: US 7,364,953 B2
(45) Date of Patent: Apr. 29, 2008

(54) MANUFACTURING METHOD TO CONSTRUCT SEMICONDUCTOR-ON-INSULATOR WITH CONDUCTOR LAYER SANDWICHED BETWEEN BURIED DIELECTRIC LAYER AND SEMICONDUCTOR LAYERS

(75) Inventor: Thuy Dao, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 231 days.

(21) Appl. No.: 10/971,657

(22) Filed: Oct. 22, 2004

(65) Prior Publication Data

US 2006/0088994 A1    Apr. 27, 2006

(51) Int. Cl.
*H01L 21/00* (2006.01)
(52) U.S. Cl. ............... 438/151; 438/157; 438/295; 438/299; 257/E21.002
(58) Field of Classification Search ......... 438/151, 438/157, 295, 299; 257/347, 348, 412
See application file for complete search history.

(56) References Cited

U.S. PATENT DOCUMENTS

| | | | |
|---|---|---|---|
| 6,239,035 B1 * | 5/2001 | Harris | 438/703 |
| 6,242,337 B1 * | 6/2001 | Okada | 438/622 |
| 6,555,445 B2 * | 4/2003 | Hayashi et al. | 438/458 |
| 7,033,888 B2 * | 4/2006 | Pan et al. | 438/257 |
| 7,074,623 B2 * | 7/2006 | Lochtefeld et al. | 438/3 |
| 7,101,752 B2 * | 9/2006 | Park et al. | 438/239 |

2002/0132451 A1 * 9/2002 Akino et al. ............ 438/478

OTHER PUBLICATIONS

Robert Chau, et al., "Gate Dielectric Scaling for High-Performance CMOS: from SiO2 to High-K," Conference presentation [PDF 335KB]; Technical paper [PDF 309KB] (see attached) (Nov. 6, 2003).
Robert Chau, "Advanced Metal Gate/High-K Dielectric Stacks for High-Performance CMOS Transistors," [PDF 395KB] (see attached) (Mar. 1, 2004).
Dr. Gerald, Marcyk, et al., "New Transistors for 2005 and Beyond," [PDF2244KB]; (see attached) (Nov. 26, 2001).
R. Chau, et al., "High-Frequency Response of 100nm Integrated CMOS Transistors with High-K Gate Dielectrics," [PDF 1727 KB] (see attached) (Dec. 4, 2001).
C. Maleville, "Multiple SOI Layers by Multiple Smart-Cut Transfers," 2000 IEEE Intl. SOI Conference, pp. 134-135 (Oct. 2000).
Hank Shin, et al., "Leakage Current Models on Thin Film Silicon-on-Insulator Devices," 1998 American Institute of Physics, vol. 72, No. 10, pp. 1199-1201 (Mar. 9, 1988).
Mark Bohr, et al., "Intel's 90 nm Logic Technology Using Strained Silicon Transistors," Intel Corporation, pp. 1-10 (Dec. 2004).

* cited by examiner

*Primary Examiner*—Mary Wilczewski
*Assistant Examiner*—Christy L Novacek
(74) *Attorney, Agent, or Firm*—John A. Fortkort; Fortkort & Houston P.C.

(57) ABSTRACT

A method for treating exposed metal in a semiconductor wafer (301) in wafer processing is disclosed herein. In accordance with the method, a wafer is provided which is equipped with a metal layer (307) and a substrate (303), wherein a portion of the metal layer is exposed at the edge of the wafer. The exposed portion of the metal layer is then covered with a dielectric material (317).

19 Claims, 6 Drawing Sheets

MANUFACTURING METHOD TO CONSTRUCT SEMICONDUCTOR-ON-INSULATOR WITH CONDUCTOR LAYER SANDWICHED BETWEEN BURIED DIELECTRIC LAYER AND SEMICONDUCTOR LAYERS

FIELD OF THE INVENTION

The present disclosure relates generally to the fabrication of semiconductor devices, and relates more particularly to methods for preventing contamination arising from exposed edges of conductor films, such as metal layers, in metal gate stacks or interconnect layers during front end processing.

BACKGROUND OF THE INVENTION

As the semiconductor industry has continued to progress toward ever smaller devices, complementary metal-oxide-semiconductor (CMOS) circuits have become increasingly more highly integrated, and the individual devices which are combined to form CMOS circuits have become increasingly smaller. In some instances, the scaling down of these devices has created a need for new technologies, as existing technologies have run into fundamental limitations that prevent them from being scaled down any further.

For example, the use of polysilicon gates in the semiconductor industry is widespread. Polysilicon gates are commonly used in conjunction with silicon dioxide ($SiO_2$) as a gate oxide or gate dielectric. However, when gate oxides are scaled down to thicknesses of less than about 20 angstroms, gate leakage currents, which are determined by quantum-mechanical direct tunneling through the gate oxide, reach intolerably high levels. Also, the scaling down of $SiO_2$-based gate oxides below these thicknesses is inhibited by dopant diffusion from the polysilicon gates, since the resulting thinner gate oxide is significantly more vulnerable to dopant penetration.

Metal gates have emerged as a solution to the aforementioned problems. The use of metal gates blocks dopant penetration and eliminates the poly depletion effect, while allowing the same electrical performance to be obtained, even with a thicker gate oxide. Typical poly depletion increases the electrical equivalent thickness of the gate oxide by 4-6 angstroms. Hence, by eliminating the poly depletion region, the use of metal gates allows gate oxides to remain 4-6 angstroms thicker, thus allowing the leakage current to be reduced by one to two orders of magnitude as compared to a polysilicon gate.

The leakage current can be further reduced by using gate dielectrics that have higher permittivity values or dielectric constants (K) than silicon dioxide. When such dielectric films, which are referred to as high-K dielectric films, are used as gate dielectrics, the physical thickness of the gate dielectric can be larger, while the electrical thickness is equivalent to $SiO_2$. This allows the dielectric layer to be scaled for compatibility with the other reduced feature sizes.

While the use of metal gates in conjunction with high-K dielectric films has many advantages and has helped to address some of the aforementioned scalability issues, it also presents problems of its own. In particular, the use of metal gates has been found to introduce metal contaminants into the fabrication line. The presence of such contaminants can seriously degrade the performance characteristics of semiconductor devices. Although manufacturing protocols have been designed to prevent such cross-contamination, these protocols typically require designated tools or extra cleaning and monitoring steps, and hence add significant processing time and cost to the manufacture of semiconductor devices.

There is thus a need in the art for a method for making semiconductor devices with metal gate structures and other conductor layers that reduces or eliminates the occurrence of metal contaminants in the manufacturing line without adding significantly to the cost of the process. There is further a need in the art for such a method which can be used to make semiconductor devices having metal gate structures with high-K dielectric films. These and other needs are met by the devices and methodologies described herein.

SUMMARY OF THE INVENTION

In one aspect, a method for treating exposed metal in a wafer is provided. In accordance with the method, a wafer is provided which is equipped with a metal layer and a substrate, wherein a portion of said metal layer is exposed at the edge of the wafer. The exposed portion of the metal layer is then covered with a dielectric material.

In another aspect, a method for treating exposed metal in a wafer is provided. In accordance with the method, a wafer is provided which comprises a substrate, a first dielectric layer, at least one metal layer, a second dielectric layer, and a channel, and wherein a portion of said at least one metal layer being exposed at the edge of the wafer. The exposed portion of the at least one metal layer is then covered with a third dielectric layer.

In a further aspect, a semiconductor device is provided which comprises (a) a semiconductor substrate, (b) a first dielectric layer, (c) a gate metal layer disposed over said first dielectric layer, said gate metal layer being indented with respect to said substrate, and (d) a second dielectric layer which is disposed over said gate metal layer and which fills said indentation in said gate metal layer.

In still another aspect, a semiconductor device is provided which comprises (a) a semiconductor substrate, (b) a first dielectric layer, (c) a bottom gate metal layer disposed over said first dielectric layer, said bottom gate metal layer being indented with respect to said substrate, (d) a second dielectric layer, said second dielectric being indented with respect to said substrate, (e) a channel layer, said channel being indented with respect to said substrate, (f) a third dielectric layer, said third dielectric being indented with respect to said substrate, (g) a top gate metal layer disposed over said third dielectric layer, said top gate metal layer being indented with respect to said substrate, and (h) a fourth dielectric layer which fills the indentation in said bottom gate metal layer and in said top gate metal layer.

These and other aspects of the present disclosure are described in greater detail below.

DETAILED DESCRIPTION

It has now been found that the aforementioned needs may be met by fabricating semiconductor wafers and devices in such a way that any conductor layers, such as gate metal layers or interconnects, that would otherwise be exposed at the edge of a wafer are encapsulated within, or are coated with, one or more layers of a dielectric material. Without wishing to be bound by theory, it is believed that exposed conductors, such as metal film surfaces exposed at the edge of a wafer, are a significant source of metal contamination in fabrication lines. Hence, by encapsulating or coating these metal film surfaces at the wafer level with a dielectric material during fabrication, a significant source of metal contamination encountered during semiconductor wafer processing is reduced or eliminated.

Figure 1:
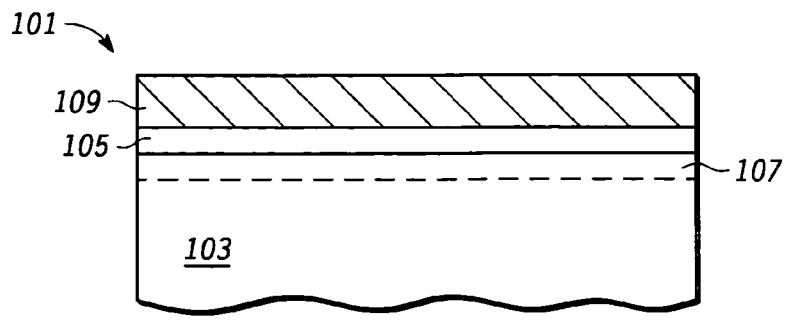
FIGS. 1-4 are illustrations of a first fabrication process in accordance with the teachings herein in which the metal gate is encapsulated in a dielectric material.

The methodologies and devices disclosed herein may be further understood with reference to the first specific, non-limiting embodiment of the method depicted in FIGS. 1-4. With reference to FIG. 1, this method begins with a wafer 101 which comprises a semiconductor substrate 103, a gate dielectric 105 and a gate metal layer 109. A channel 107 is provided in the portion of the substrate 103 adjacent to the gate dielectric 105. The channel 107 (only a portion of which is depicted) may be an SOI silicon channel, a strain silicon (SS) channel, or other channel types as are known to the art.

The substrate 103 may comprise mono-crystalline silicon, or other types of semiconductor materials as are known to the art, including, for example, silicon carbon, silicon germanium, germanium, type IIIV semiconductor materials, type IIVI semiconductor materials, and combinations thereof. The substrate may also comprise multiple layers of different semiconductor materials. In some embodiments, the semiconductor material of substrate 103 may be strained, as through the application of compressive strain or tensile strain. Thus, for example, in a PMOS device, a selectively deposited SiGe source-drain structure may be used to induce channel strain in the device, while in an NMOS device, a high stress $Si_3Ni_4$ cap layer may be used to induce channel strain.

The gate dielectric 105 may comprise silicon oxide or other dielectrics, including, for example, oxynitride, hafnium oxide, aluminum oxide, tantalum oxide, lantanium oxide, hafnium oxynitride, iridium oxynitride and/or other high K dielectric materials. Gate dielectric 105 may be formed by a growing process, a deposition process, or through other suitable methods.

The gate metal layer 109 comprises a suitably conductive metal, which may be a pure metal or a metal alloy. Some examples of possible gate metals include tungsten, tungsten silicon, tungsten titanium nitride, titanium, titanium nitride, titanium silicon, titanium silicon nitride, tantalum, tantalum silicon, tantalum nitride, tantalum silicon nitride, molybdenum, and other metals or combinations thereof. The gate metal may also comprise multiple layers of conductive materials. The gate metal preferably has a suitable work function and required thermal and chemical stability with the underlying thin gate dielectrics for gate-first CMOS processing, especially for high-K dielectrics such as $HfO_2$, $ZrO_2$ and their silicates.

In the device depicted in FIG. 1, the gate metal layer 109 is exposed at the edge of the wafer. Hence, without further processing in accordance with the teachings herein, the exposed gate metal will be a source of metal contamination in later processing. This issue is dealt with in the subsequent processing steps shown in FIGS. 2-5.

Figure 2:
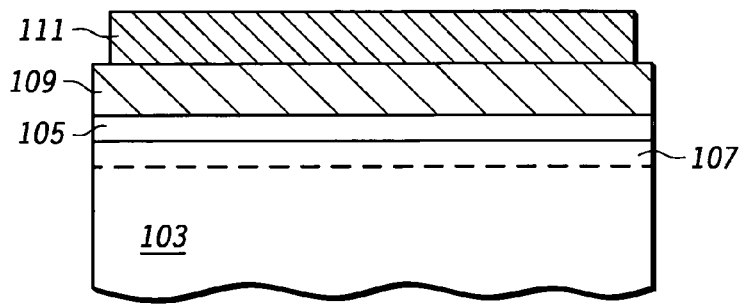

As shown in FIG. 2, a layer of photoresist 111 is coated over the gate metal layer 109, followed by photoresist back-wash or patterning such that the edges of the gate metal are exposed. The exposed edges of the gate metal layer 109 are then etched down to the gate dielectric layer 105 using a suitable etchant. The photoresist is then stripped, and one or more layers of a dielectric material 113 are deposited over the gate metal layer 109, thus resulting in the structure depicted in FIG. 3. As seen in that structure, the gate metal layer 109 is encapsulated between the dielectric material 113 and the gate dielectric layer 105, thus preventing metal contamination from the gate metal film during subsequent processing. A similar process may be used to treat exposed metal interconnects.

There are a number of possible variations to the aforementioned process. For example, in the process steps illustrated in FIGS. 2-3, the etching is stopped at the gate dielectric layer 105, with the result that the subsequently deposited dielectric material 113 only extends down to that layer along the edges of the wafer or device. However, in other embodiments, the etching is stopped instead at the channel 107. The photoresist is then stripped, and one or more layers of a dielectric material 113 are deposited over the gate metal layer 109, thus resulting in the structure shown in FIG. 4 in which the dielectric material 113 extends down to the channel 107 along the edges of the wafer.

Figure 3:
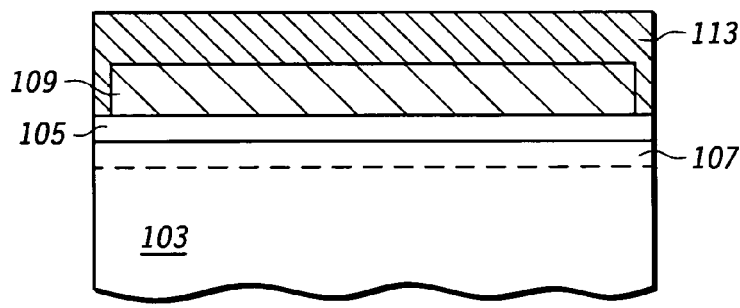
Figure 4:
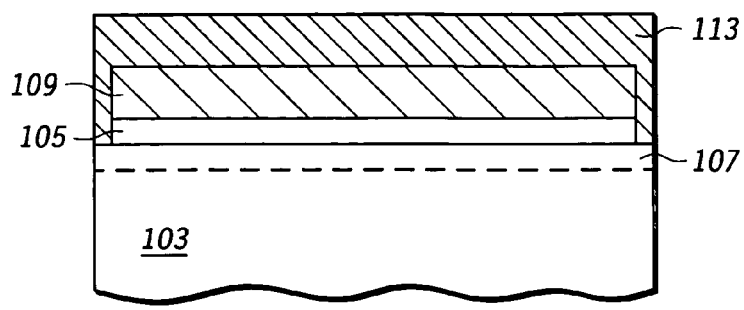

Further variations to the method depicted in FIGS. 1-3 and to the method depicted in FIGS. 1-2 and 4 are possible through the use of chemical mechanical polishing (CMP). In these variations, the dielectric material 113 is deposited as described above, but to additional thickness. Then, CMP is used to reduce the thickness of the dielectric material 113 to a desired target thickness. This approach serves to planarize the dielectric layer 113, thus reducing or eliminating curvature and/or non-uniformity at the edge of the wafer.

The methodologies disclosed herein have thus far been depicted with respect to the encapsulation of gate metal in a relatively simple structure or wafer. However, these methodologies may also be incorporated into the fabrication of more complex structures. One specific, non-limiting embodiment of such a process is depicted in FIGS. 5-9, which illustrate the implementation of the methodologies disclosed herein in the context of the fabrication of a fully depleted semiconductor-on-insulator (FDSOI) wafer. A similar process could be used in conjunction with a partially depleted semiconductor-on-insulator (PDSOI) wafer.

Figure 5:
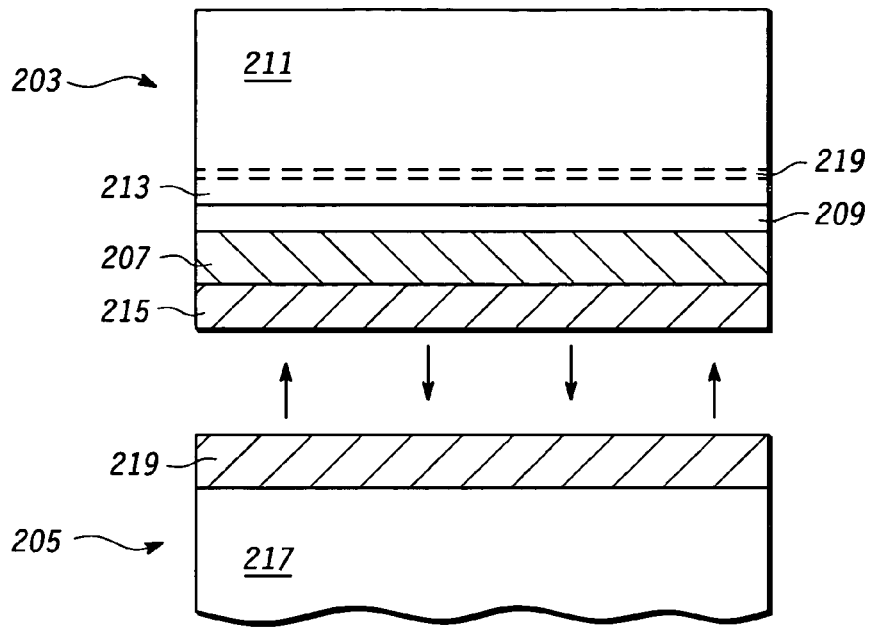
FIGS. 5-9 are illustrations of a second fabrication process in accordance with the teachings herein in which the metal gate is encapsulated in a dielectric material.

FIG. 5 depicts one embodiment of the formation of the FDSOI wafer. As shown therein, the FDSOI wafer (201 in FIG. 6) is formed by bonding together a donor wafer 203 and a handle wafer 205. The donor wafer 203 includes a gate metal layer 207, a gate dielectric 209, and a semiconductor substrate 211. The gate metal layer 207 may comprise any of the gate metals previously noted. In the particular embodiment depicted, the channel region 213 is disposed within the substrate 211.

An insulator 215 is formed (as through growth or deposition) over the gate metal layer 207. Preferably, the insulator 215 comprises silicon oxide, but it may also comprise other materials such as, for example, PSG, FSG, silicon nitride, and/or other types of dielectrics.

The handle wafer 205 includes a semiconductor substrate 217 with or without an insulator 219 formed thereon. The material of the insulator 219 may be the same as, or distinct from, the material of insulator 215. In some embodiments, handle wafer 205 may include a metal layer (not shown) at a location in the middle of insulator 219. This metal layer may be utilized for noise reduction in analog devices built from the resultant FDSOI wafer 201, and may also be coated or encapsulated as needed in accordance with the methodologies disclosed herein.

The donor wafer 203 is shown inverted so as to be bonded to the handle wafer 205 in the orientation depicted in FIG. 5. In one embodiment, the insulator 215 is bonded to the insulator 219 with a bonding material. In other embodiments, the donor wafer 203 may be bonded to the handle wafer 205 using other bonding techniques. For example, in one embodiment, the donor wafer 203 may be bonded to the handle wafer 205 by electrostatic bonding, followed by thermal bonding or pressure bonding. Also, in some embodiments, the handle wafer 205 does not include the insulator 219; rather, the insulator 215 on the donor wafer 203 is bonded directly to substrate 217 of the handle wafer 205.

The donor wafer 203 includes a stress layer 219 formed by implanting a dopant (e.g. H$^+$) into the substrate 211. In some embodiments, the dopant is implanted prior to the formation of the gate dielectric 209, but in other embodiments, the dopant may be implanted at other points in the process, including after the formation of the gate dielectric 209 and prior to the formation of the gate metal layer 207, after the formation of the gate metal layer 207 and prior to the formation of the insulator 215, or after the formation of the insulator 215. In other embodiments, the dopant for forming the stress layer 219 may be implanted after the handle wafer 205 has been bonded to the donor wafer 203.

Figure 6:
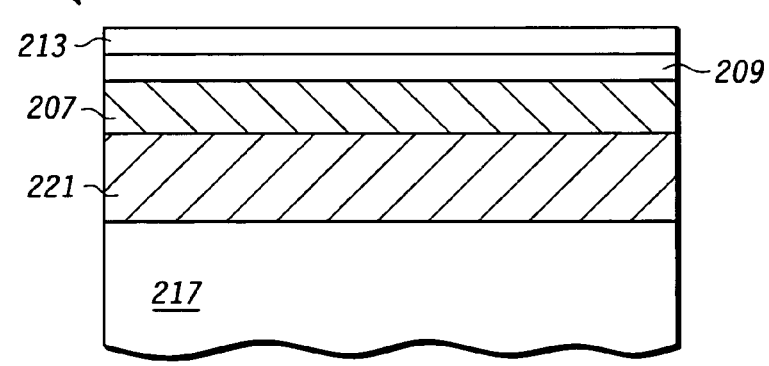

FIG. 6 shows a side view of the resultant FDSOI wafer 201 after the handle wafer 205 and the donor wafer 203 have been bonded together and after the top portion of substrate 211 has been removed (see FIG. 5), as, for example, by cleaving. Such cleaving is typically performed by dividing the substrate 211 at stress layer 219. Channel layer 213 is the portion of the substrate 211 which remains after cleaving. One advantage of forming the channel region layer by cleaving is that it may allow for a channel region to be formed from a relatively pure and crystalline structure, as opposed to a semiconductor layer that is grown or deposited on a dielectric (e.g., gate conductor 207).

In the device depicted in FIG. 6, the gate metal layer 207 is exposed at the edge of the wafer. Hence, without further processing in accordance with the teachings herein, the exposed gate metal will be a source of metal contamination in later processing. This issue is dealt with in the subsequent processing steps shown in FIGS. 7-9.

Figure 7:
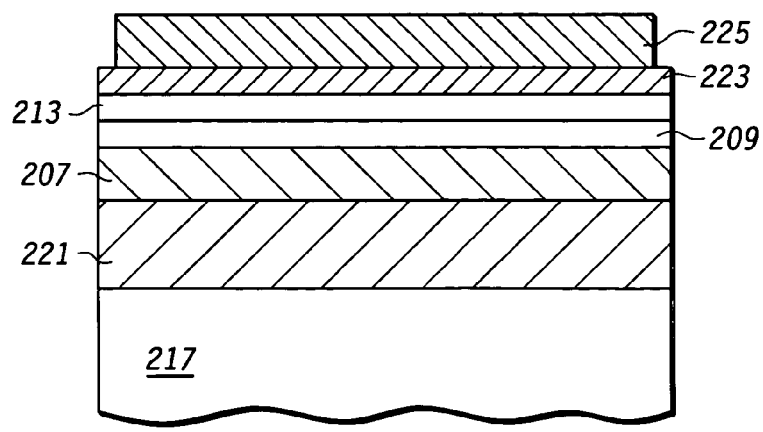
Figure 8:
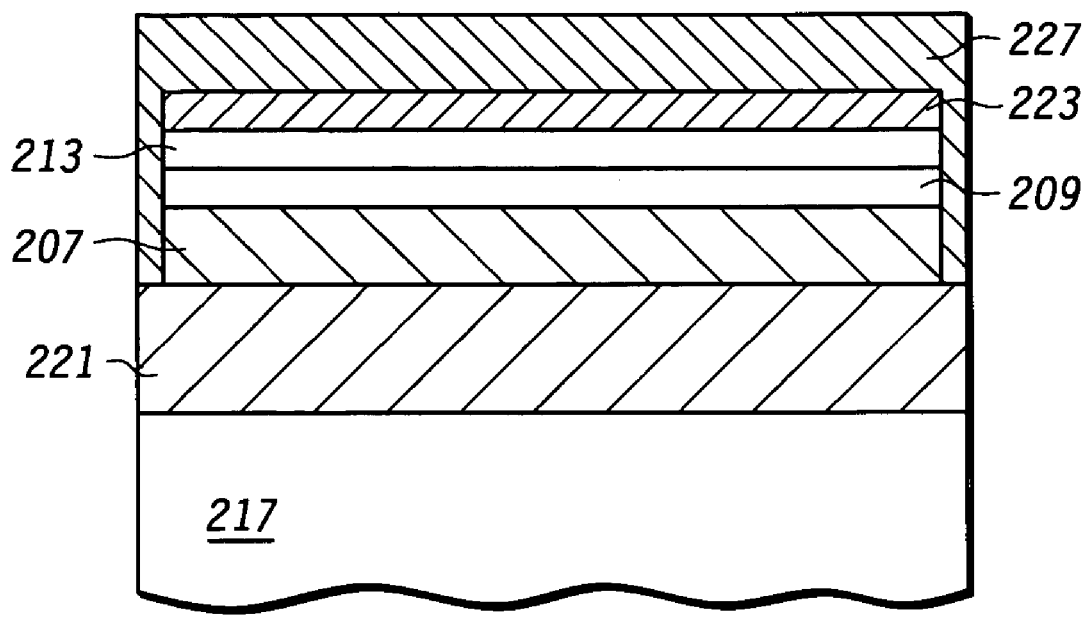
Figure 9:
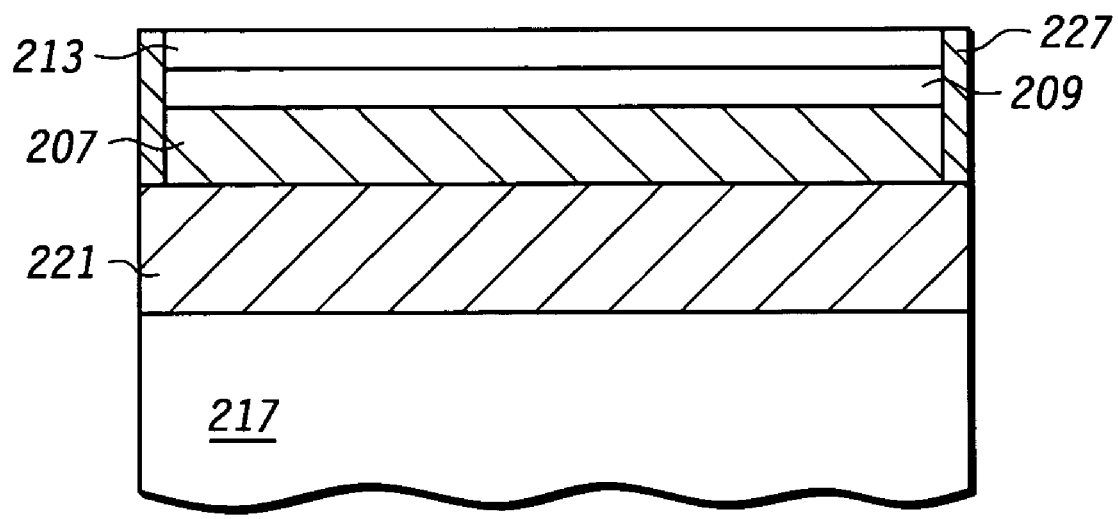

FIGS. 7-9 illustrate the processing steps that may be used to encapsulate the gate metal layer 207 after formation and cleavage of the FDSOI wafer. As shown in FIG. 7, a dielectric material 223 is deposited over the channel layer 213. This dielectric material 223, which may have a monolayer or multilayer construction, may comprise, for example, a layer of nitride deposited over a thin layer of oxide. A layer of photoresist 225 is then deposited and back-washed or patterned over the dielectric material 223 such that a portion of the dielectric material 223 is exposed along the edge of the wafer.

As shown in FIG. 8, the exposed portion of the dielectric layer 223 and the underlying portions of the channel 213, the gate dielectric 209 and the gate metal layer 207 are etched, thus exposing a portion of dielectric layer 221. A layer 227 of dielectric material is then deposited or applied by a spin-on process over the dielectric material 223 and over the exposed surfaces of the channel layer 213, the gate dielectric 209, the gate metal layer 207, and the dielectric layer 221, thereby thoroughly encapsulating the gate metal layer 207.

Next, chemical mechanical polishing (and, in some embodiments, cleaning steps) are utilized to planarize the wafer surface and to expose the channel 213 as shown in FIG. 9.

Figure 16:
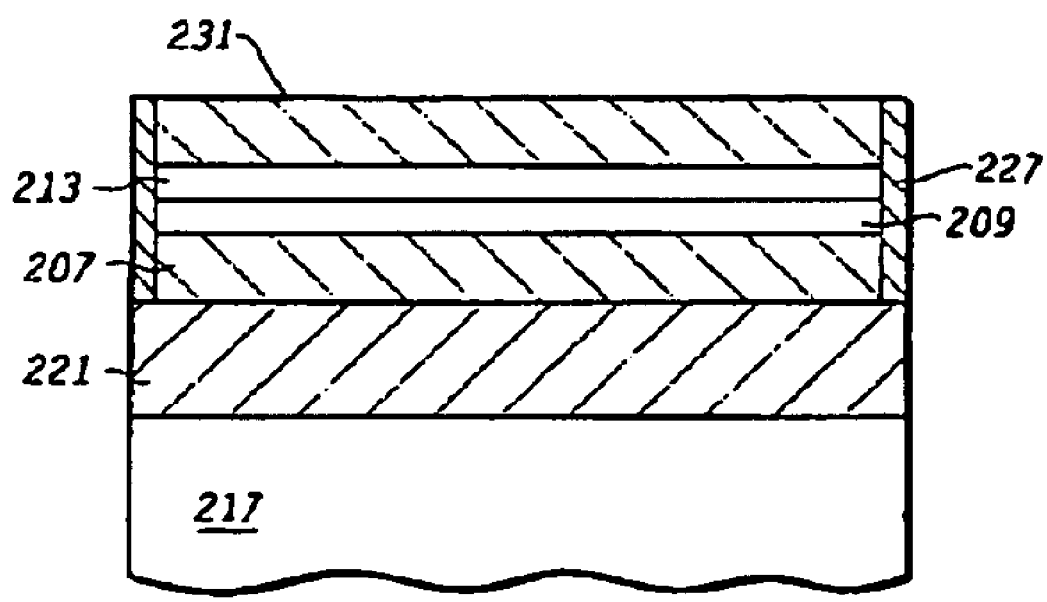
FIG. 16 is a semiconductor structure in accordance with the teachings herein.

One skilled in the art will appreciate that the foregoing methodology may also be applied to semiconductor structures having multiple gate metal layers therein. One such structure is depicted in FIG. 16. This structure is identical to the structure of FIG. 9, except that a second gate metal layer 231 has been defined in the structure. A structure of the type depicted in FIG. 16 may be utilized, for example to make a planar double gate FDSOI.

In the approaches described above, masking techniques are used to selectively etch the edge of a wafer so as to selectively remove a portion of the gate metal, after which the gate metal is encapsulated or covered through the application of one or more suitable dielectric materials. However, it will be appreciated that a similar effect may be obtained through other methodologies. For example, in some embodiments of the methodologies described herein, a portion of the dielectric material used to encapsulate the metal gate is deposited or formed prior to formation of the metal gate layer.

Figure 10:
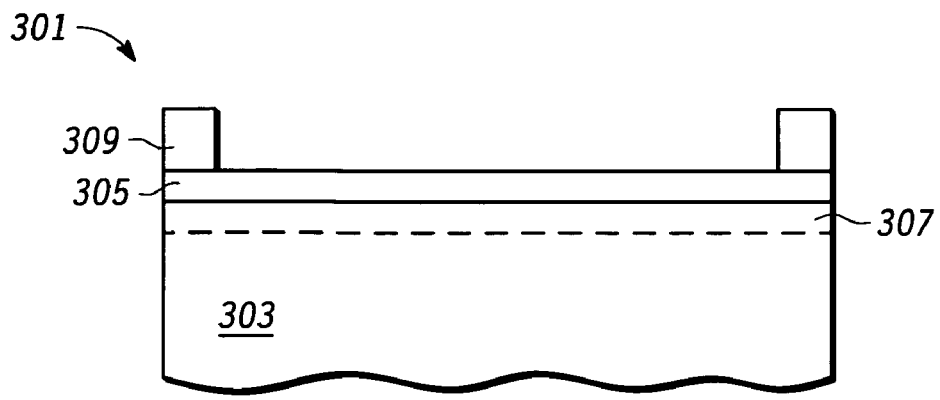
FIGS. 10-12 are illustrations of a third fabrication process in accordance with the teachings herein in which the metal gate is encapsulated in a dielectric material.
Figure 11:
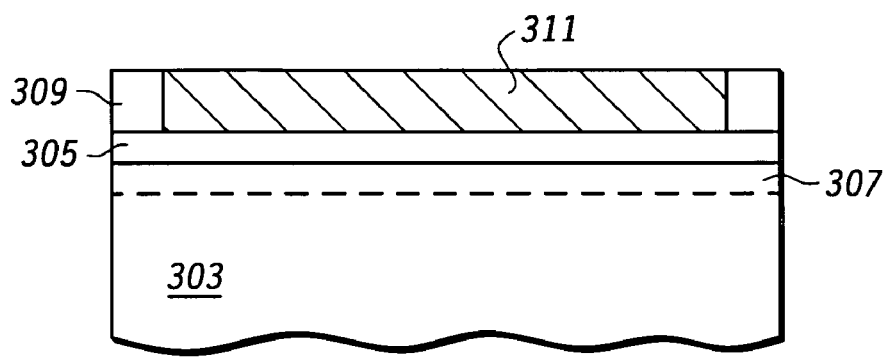
Figure 12:
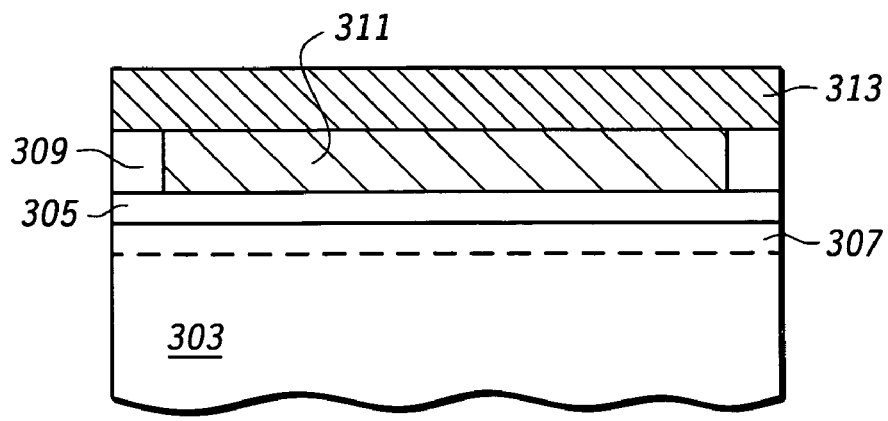

One example of this type of approach is illustrated in FIGS. 10-12. With reference to FIG. 10, this method begins with a device 301 which comprises a semiconductor substrate 303 and a gate dielectric 305. A channel 307 is provided in the portion of the substrate 303 adjacent to the gate dielectric 305. A dielectric material 309 is disposed over the gate dielectric 305 and is suitably patterned, as through masking and etching, to provide an opening therein in which the gate dielectric 305 is exposed. The dielectric material 309 in this embodiment may be the same as, or different from, the gate dielectric 305, and may also comprise one or more layers of distinct materials. Moreover, in some variations, the dielectric material 309 may extend down to channel 307 rather than terminating at the gate dielectric 305 as illustrated.

As shown in FIG. 11, the gate metal layer 311 is deposited, followed by CMP, so that the only portion of the gate metal layer remaining is within the opening provided in the dielectric layer 309. A dielectric layer 313, which may comprise the same or different materials as dielectric layer 309 or gate dielectric 305, is then deposited over the gate metal layer 311 and dielectric layer 309 as shown in FIG. 12, thereby encapsulating the surfaces of the gate metal layer 311 and, in particular, the edges thereof.

In other embodiments, a structure (which may be, for example, of the type depicted in FIG. 6) is provided in which the gate metal is exposed at the edge of the structure. Selective metal etching is then utilized to form a recess in the gate metal layer along the side of the device. This recess is then backfilled with a dielectric material, as through deposition or through other suitable methodologies.

Figure 13:
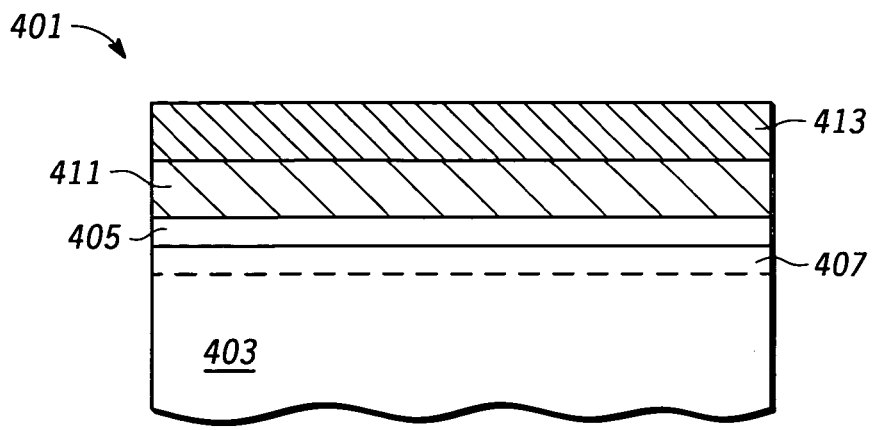
FIGS. 13-15 are illustrations of a fourth fabrication process in accordance with the teachings herein in which the metal gate is encapsulated in a dielectric material.
Figure 14:
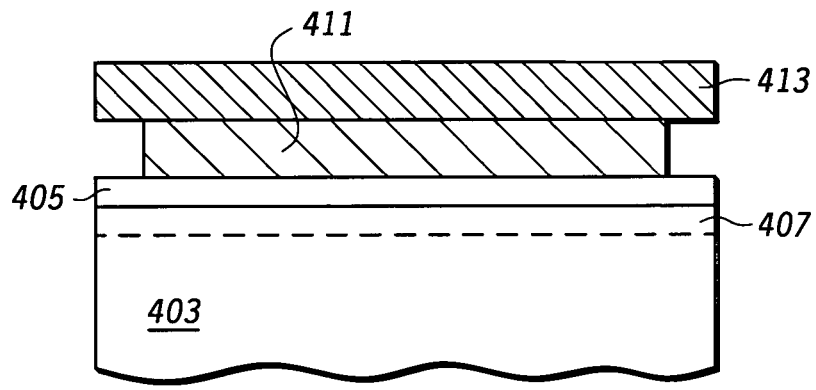
Figure 15:
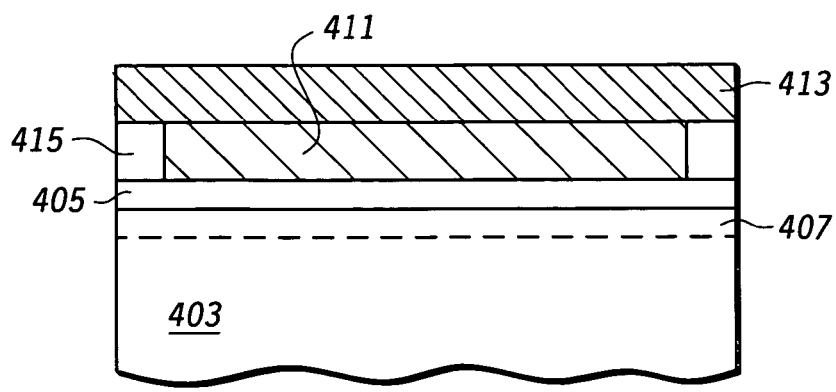

One example of this type of approach is illustrated in FIGS. 13-15. With reference to FIG. 13, this method begins with a device 401 which comprises a semiconductor substrate 403 and a gate dielectric 405. A channel 407 is provided in the portion of the substrate 403 adjacent to the gate dielectric 405. A gate metal layer 411 is deposited on the gate dielectric 405, and a dielectric layer 413, which may comprise the same or different materials as gate dielectric 405, is then deposited over the gate metal layer 411.

As shown in FIG. 14, the exposed edges of the gate metal layer 411 are then selectively etched using a suitable metal etchant. The cavity formed by the etching operation is then backfilled with a dielectric material 415 as shown in FIG. 15, thereby encapsulating the surfaces of the gate metal layer 411 and, in particular, the edges thereof, within one or more dielectric materials.

In still other embodiments, a structure (which may be, for example, of the type depicted in FIGS. 1 and 6) is provided in which a gate metal or metal interconnect is exposed at the edge of the structure. A dielectric material is then disposed over the portion of the edge of the structure where the gate metal or interconnect is exposed (in some variations, the dielectric material is disposed over the entire edge of the structure or wafer). This approach may be used in conjunction with CMP or other such processes so as to provide a surface with acceptable characteristics.

In the various methodologies described above, the exposed metal surfaces which are to be encapsulated may be suitably treated, if necessary, to ensure an adequate bond between the dielectric material and the metal surface. Such treatments, which are well known in the art, may include oxidation of the exposed metal surfaces, and/or surface roughening by chemical or mechanical means.

The amount of gate metal or interconnect metal removed in the various methodologies described above can vary, as can the thickness of the dielectric layer which is used to replace the removed portion of the metal. This amount or thickness will depend on such factors as the wafer size and the choice of dielectric material used. For example, in a 300 mm wafer, the width of the portion of gate metal or interconnect removed is preferably equal to the width of the dielectric layer which is used to replace the removed portion of the metal, and is typically less than 1 cm, is preferably less than 0.5 cm.

The methodologies disclosed herein have been primarily described and illustrated with respect to single gate devices. It will be appreciated, however, that these methodologies are equally applicable to multi-gate devices. For example, these methodologies can be used in the fabrication of planar double gate FDSOI devices having a top gate and a bottom gate. In such cases, any of the gate metal layers and interconnect layers that have exposed edges may be treated in accordance with the methodologies disclosed herein.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for making a semiconductor device, comprising;
   providing a wafer comprising a semiconductor substrate and a first dielectric layer;
   forming a metal gate disposed over said first dielectric layer, said metal gate being indented with respect to said substrate and being near the edge of the wafer; and
   forming a second dielectric layer which fills said indentation;
   wherein the step of forming the second dielectric layer occurs before the step of forming the metal gate.

2. The method of claim 1, wherein the gate is formed in an aperture created in the second dielectric layer.

3. The method of claim 2, further comprising the step of forming the metal gate from a gate metal layer, and wherein the metal gate is formed by:
   depositing the gate metal layer; and
   subjecting the gate metal layer to chemical mechanical polishing.

4. A method for treating exposed metal during wafer processing, comprising:
   providing a wafer equipped with a metal layer disposed between a substrate and a first dielectric layer, wherein said first dielectric layer comprises a first dielectric material, and wherein a portion of said metal layer is exposed at the edge of the wafer;
   removing a portion of the metal layer such that the metal layer is indented with respect to the substrate and the first dielectric layer; and
   backfilling the indentation with a second dielectric material.

5. The method of claim 4, wherein the step of backfilling the indentation with a second dielectric material comprises:
   depositing a layer of the second dielectric material over the wafer; and
   subjecting the wafer to chemical mechanical polishing until the metal layer is exposed.

6. The method of claim 4, wherein the first dielectric material is a high-k dielectric material.

7. The method of claim 4, further comprising a buried oxide layer disposed between the substrate and the metal layer.

8. The method of claim 4, wherein the wafer is an FDSOI wafer.

9. The method of claim 4, wherein the wafer is an PDSOI wafer.

10. The method of claim 4, wherein the wafer is a planar double gate device.

11. The method of claim 4, wherein the metal layer comprises a gate.

12. The method of claim 4, wherein the metal layer comprises an interconnect.

13. The method of claim 4, further comprising a layer of a third dielectric material disposed between the metal layer and the semiconductor wafer.

14. The method of claim 13, wherein the semiconductor wafer has a channel defined therein, and wherein the channel is adjacent to the layer of the third dielectric material.

15. A method for making a semiconductor device, comprising:
   providing a semiconductor wafer having a first dielectric layer disposed thereon;
   forming a second dielectric layer over the first dielectric layer, wherein said second dielectric layer extends to the edge of the wafer;
   forming an opening in the second dielectric layer which exposes a portion of the first dielectric layer, said opening being disposed near the edge of the wafer; and
   forming a metal gate in the opening.

16. The method of claim 15, wherein the second dielectric layer extends from the metal gate to the edge of the wafer.

17. The method of claim 15, further comprising the step of forming the metal gate from a metal gate layer, and wherein the metal gate is formed by:
   depositing the metal gate layer; and
   subjecting the metal gate layer to chemical mechanical polishing.

18. The method of claim 15, wherein said semiconductor wafer has a channel defined therein, the channel being adjacent to the first dielectric layer.

19. The method of claim 15, wherein the metal gate is formed by depositing a layer of metal over the opening, and subjecting the resulting structure to chemical mechanical polishing (CMP).

* * * * *